(12) United States Patent
Franch et al.

(10) Patent No.: US 7,400,555 B2
(45) Date of Patent: Jul. 15, 2008

(54) BUILT IN SELF TEST CIRCUIT FOR MEASURING TOTAL TIMING UNCERTAINTY IN A DIGITAL DATA PATH

(75) Inventors: Robert L. Franch, Wappingers Falls, NY (US); William V. Huott, Holmes, NY (US); Norman K. James, Liberty Hill, TX (US); Phillip J. Restle, Katonah, NY (US); Timothy M. Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 10/712,925

(22) Filed: Nov. 13, 2003

(65) Prior Publication Data

US 2005/0107970 A1   May 19, 2005

(51) Int. Cl.
  *G04F 10/00* (2006.01)
  *H03K 11/26* (2006.01)
  *G06K 5/00* (2006.01)
(52) U.S. Cl. .................. 368/120; 327/263; 714/700
(58) Field of Classification Search .......... 368/113, 368/118–120; 327/261, 263, 291, 292; 324/73.1; 714/700, 724, 733; 702/79, 89, 176
  See application file for complete search history.

(56) References Cited

U.S. PATENT DOCUMENTS

| | | | | |
|---|---|---|---|---|
| 4,494,021 A | * | 1/1985 | Bell et al. | 327/262 |
| 4,841,551 A | * | 6/1989 | Avaneas | 375/371 |
| 5,199,008 A | * | 3/1993 | Lockhart et al. | 368/117 |
| 5,309,035 A | * | 5/1994 | Watson et al. | 327/141 |
| 5,309,111 A | * | 5/1994 | McNeely et al. | 327/7 |
| 5,684,760 A | * | 11/1997 | Hunter | 368/120 |
| 5,793,709 A | * | 8/1998 | Carley | 368/113 |
| 5,936,912 A | * | 8/1999 | Kawabata et al. | 365/233.11 |
| 6,006,025 A | | 12/1999 | Cook et al. | |
| 6,058,496 A | * | 5/2000 | Gillis et al. | 714/727 |
| 6,111,925 A | * | 8/2000 | Chi | 375/354 |
| 6,205,571 B1 | | 3/2001 | Camporese et al. | |
| 6,311,313 B1 | | 10/2001 | Camporese et al. | |
| 6,316,979 B1 | * | 11/2001 | Keeth | 327/258 |
| 6,437,713 B1 | * | 8/2002 | Lesea | 341/78 |
| 6,493,653 B1 | | 12/2002 | Drinkard et al. | |
| 6,504,414 B2 | | 1/2003 | Saeki | |

(Continued)

*Primary Examiner*—Vit W Miska
(74) *Attorney, Agent, or Firm*—Law Office of Charles W. Peterson, Jr.; Louis J. Percello, Esq.; Brian P. Verminski, Esq.

(57) ABSTRACT

A circuit for measuring timing uncertainty in a clocked digital path and in particular, the number of logic stages completed in any clock cycle. A local clock buffer receives a global clock and provides a complementary pair of local clocks. A first local (launch) clock is an input to a delay line, e.g., 3 clock cycles worth of series connected inverters. Delay line taps (inverter outputs) are inputs to a register that is clocked by the complementary clock pair to capture progression of the launch clock through the delay line and identify any variation (e.g., from jitter, VDD noise) in that progression. Global clock skew and across chip gate length variation can be measured by cross coupling launch clocks from a pair of such clock buffers and selectively passing the local and remote launch clocks to the respective delay lines.

29 Claims, 8 Drawing Sheets

U.S. PATENT DOCUMENTS

| | | | |
|---|---|---|---|
| 6,801,070 B2 * | 10/2004 | Gomm et al. | 327/263 |
| 6,822,925 B2 * | 11/2004 | Van De Graaff | 365/233.11 |
| 7,034,596 B2 * | 4/2006 | Andrews et al. | 327/257 |
| 7,219,269 B2 * | 5/2007 | Frisch | 714/700 |
| 2003/0108137 A1 | 6/2003 | Li et al. | |
| 2003/0120456 A1 | 6/2003 | Watson, Jr. et al. | |
| 2004/0049703 A1 * | 3/2004 | Maksimovic et al. | 713/300 |

* cited by examiner

BUILT IN SELF TEST CIRCUIT FOR MEASURING TOTAL TIMING UNCERTAINTY IN A DIGITAL DATA PATH

CROSS REFERENCE TO RELATED APPLICATION

The present invention is related to issued U.S. Pat. No. 7,289,369, entitled "CLOCK GATED POWER SUPPLY NOISE COMPENSATION" to Phillip J. Restle, filed coincident herewith and assigned to the assignee of the present invention.

BACKGROUND OF THE INVENTION

1. Field of the Invention

The present invention is related to integrated circuit (IC) design systems and more particularly to characterizing timing uncertainties in ICs.

2. Background Description

Large high performance very large scale integration (VLSI) chips like microprocessors are synchronized to an internal clock. A typical internal clock is distributed throughout the chip, triggering chip registers to synchronously capture incoming data at the register latches and launch data from register latches. Ideally, each clock edge arrives simultaneously at each register every cycle and data arrives at the register latches sufficiently in advance of the respective clock edge, that all registers latch the correct data and simultaneously. Unfortunately, various chip differences can cause timing uncertainty, i.e., a variation in edge arrival to different registers.

Such timing uncertainties can arise from data propagation variations and/or from clock arrival variations. Data propagation variations, for example, may result in a capturing latch that randomly enters metastability or latches invalid data because the data may or may not arrive at its input with sufficient set up time. Clock edge arrival variations include, for example, clock frequency fluctuations (jitter) and/or register to register clock edge arrival variations (skew). Both data path and clock edge arrival variations can arise from a number of sources including, for example, ambient chip conditions (e.g., local temperature induced circuit variations or circuit heat sensitivities), power supply noise and chip process variations. In particular, power supply noise can cause clock propagation delay variations through clock distribution buffers. Such clock propagation delay variations can cause skew variations from clock edge arrival time uncertainty at the registers. Typically, chip process variations include device length variations with different device lengths at different points on the same chip. So, a buffer at one end of a chip may be faster than another identical (by design) buffer at the opposite end of the same chip. Especially for clock distribution buffers, these process variations are another source of timing uncertainty.

Furthermore, as technology features continue to shrink, power bus or $V_{dd}$ noise is becoming the dominant contributor to total timing uncertainty. High speed circuit switching may cause large, narrow current spikes with very rapid rise and fall times, i.e., large dI/dt. In particular, each of those current spikes cause substantial voltage spikes in the on-chip supply voltage, even with supply line inductance (L) minimum. Because V=LdI/dt, these supply line spikes also are referred to as L di/dt noise. Since current switching can vary from cycle to cycle, the resulting noise varies from cycle to cycle. When the $V_{dd}$ noise drops the on-chip supply voltage in response to a large switching event, it slows the entire chip, including both the clock path (clock buffers, local clock blocks, clock gating logic and etc.) as well as the data path logic (combinational logic gates, inverters and etc.). When the noise dissipates and the on-chip supply later recovers, or even overshoots as the supply current falls; then, the circuits (buffers, gates and etc.) in these same paths speed up, returning to their nominal performance (with the normal stage delay) or even faster. The number of stages that can complete changes as the data path slows down or speeds up relative to the clock path. Currently, in particular, such switching noise is the dominant component of total timing uncertainty, more even than skew or jitter (which are themselves affected by switching noise) or chip process variations. Thus, it would be useful to be able to determine switching noise and how it affects circuit performance Clock skew and jitter, power supply noise and chip ambient and process variations may be considered the primary sources of timing uncertainty. In particular, the overall or total timing uncertainty is a complex combination of both clock and data path uncertainty that reduces the number of combinational logic stages (typically called the fan out of 4 (FO4) number) that can be certifiably completed in any clock cycle and so, reduces chip performance. The FO4 number is the number of fan-out of four inverter delays that can fit in one cycle. This design parameter serves to determine chip pipeline depth, e.g., in a microprocessor. By design, register latch boundaries are determined by the maximum number of logic stages (FO4) that may be guaranteed to be completed in every clock cycle. Typically, designers apply some guard band number to the FO4 number (i.e., reduce the FO4 number by some delta) to account for timing uncertainties. Previously, this delta was a guess of how the number of combinational logic stages that can be completed had changed from cycle to cycle. If the guess was too high, chip problems would result. If not, there was no way to determine if that guess was too low and by how much.

Thus, there is a need for a way to measure the number of logic stages that can be completed in a cycle.

SUMMARY OF THE INVENTION

It is a purpose of the invention to improve integrated circuit (IC) chip design;

It is another purpose of the invention to facilitate determination of timing path variations;

It is yet another purpose of the invention to reliably measure on chip timing uncertainty;

It is yet another purpose of the invention to accurately determine the number of completed logic stages on a cycle by cycle basis and monitor and log the worst-case timing variations.

It is yet another purpose of this invention to accurately recover the VDD power bus noise waveform by noting the cycle to cycle changes in the number of completed inverter stages and relating this plot to VDD drop in mV based on a set of calibration runs where VDD was varied with no noise present (i.e. with quiet chip conditions).

The present invention relates to a circuit for measuring timing uncertainties in a clocked data path. A local clock buffer receives a global clock and provides a complementary pair of local clocks. A first local (launch) clock is an input to a delay line, e.g., 3 clock cycles worth of series connected inverters. Delay line taps (inverter outputs) are inputs to a register that is clocked by the complementary clock pair to capture progression of the launch clock through the delay line and identify any variation (e.g., from power bus noise or jitter) in that progression. Skew can be measured by cross coupling launch clocks from a pair of such clock buffers and selectively passing the local and remote launch clocks to the respective delay lines.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
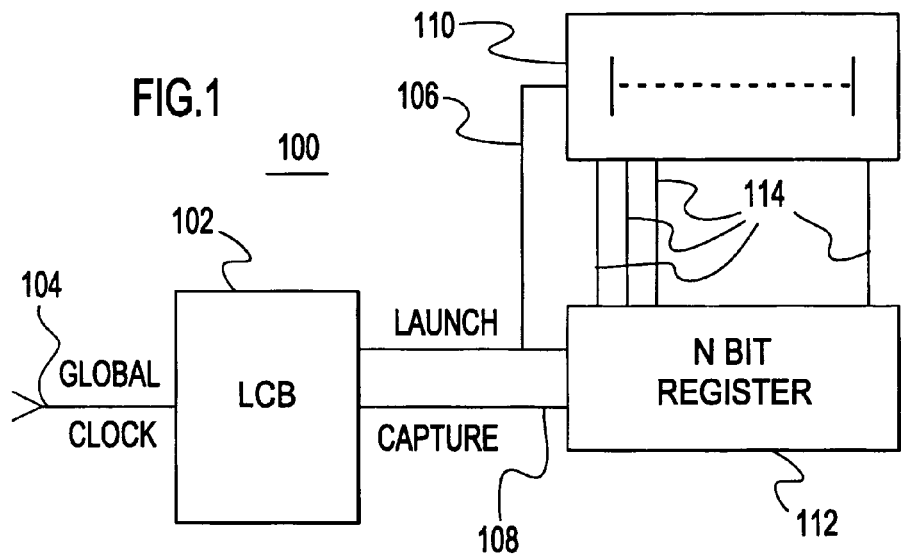
FIG. 1 shows a block diagram of an example of a logic stage counter 100 according to a preferred embodiment of the present invention.

Turning now to the drawings and, more particularly, FIG. 1 shows a block diagram of an example of a logic stage counter 100 according to a preferred embodiment of the present invention. A local clock block (LCB) or clock buffer 102 receives and re-drives a global chip clock 104 into 2 complementary local clocks 106, 108. One clock, a launch clock 106, is provided to a delay line 110 and launches the timing edge in the delay. The LCB 102 and delay line 110 mimic data propagation delay through an actual data path, e.g., in a microprocessor. Both clocks 106, 108 clock an N bit register 112. Delay line taps 114 are stage inputs to N bit register 112. For example, N=129 may be a convenient length for holding 3 cycles worth of edges. The second clock, a capture clock 108, captures the forward position of the timing edges in the N bit register 112. Although in this example, the launch clock 106 drives the delay line 110, either clock, the launch or the capture clock can drive the delay line 110. In this example, the rising edge of launch clock 106 and the falling edge of the capture clock 108 (which latches the data) are coincident and are derived from the same global clock 104 edge. This rising edge is the principal edge of interest and marks the end/start of the cycle boundary. It should be noted that the present invention is described herein with the registers (e.g., 112) being clocked by complementary clocks 106, 108. This is for example only and not intended as a limitation and the registers/latches may be pulsed latches or any suitable equivalent register/latch such as are well known in the art.

The launch clock 106 drives the delay line 110 and, preferably, the delay difference between each pair of taps 114 is equivalent to one logic block delay. Typically, the total timing uncertainty metric is the number of combinational logic stages that complete in a cycle, sometimes referred to as the fan-out of 4 (FO4) inverter count or FO4 number. However, for the best time resolution the preferred delay between delay line taps 114 is the minimum delay for the particular technology, e.g., the delay for a single fan-out inverter (FO1 inverter). Preferably, the delay line 110 is at least three clock periods long, i.e., long enough that the start of one clock cycle, the leading clock edge, has not propagated through the delay line 110 before the start of second following cycle enters the delay line 110. Therefore, preferably, the delay line 110 normally has 3 edges passing through it. The N bit register 112 is clocked by both the launch clock 106 and the capture clock 108. Essentially, at the start of a global clock period, the launch clock 106 passes a previously loaded N bits out of the register 112 as the leading edge begins traversing the delay line 110. At the end of each global clock period, the capture clock 108 latches the state of the delay line taps 114 in the capture register 112, capturing the progress of the launch clock 106 edges through the delay line 110. In the absence of jitter or other sources of timing uncertainty, the location of the edges (tap number) does not change from cycle to cycle.

So, for example, the delay line 110 may be a series of suitably loaded inverters with delay line taps 114 being the inverter outputs. As a result, the taps 114 alternate ones and zeros and the clock edges are located by a matched pair (either 2 zeros in a row, or 2 ones in a row) of adjacent delay line taps 114. The space between matching tap pairs, e.g., 60 inverter stages between leading/rising clock edges, is a measure of logic propagation during a complete clock cycle. Thus, the same local clock block 102 both launches and captures the timing edges and, because the local clock itself is the launched data, the clock takes a snapshot of itself in the capturing latches. The captured edges are evenly spaced in the absence of timing uncertainty either in the clock path or data path. However, timing uncertainty and in particular, jitter, e.g., from local or chip noise, is exhibited in a variation in the tap number where the edges get captured.

In particular, the present invention may be used to identify a poor clock source, e.g., a phase locked loop (PLL) with significant jitter may be identified as a source of timing uncertainty. It may be useful to understand if the PLL has an occasional short cycle or, worse, 2 or more short cycles in a row, the occurrence of which may be found from 3 cycles worth of edges stored in the capture register. So, for example, the first edge (e.g., a leading or rising edge) is always captured in bit position 0 (register latch 0) and in the absence of jitter, the second (leading) edge is in bit 60 and the third in bit position 120. Without jitter the edges always fall in the same bit positions. However, with an occasional short cycle the second edge (for the shorter cycle) shifts by one to bit 59; the third edge is captured in bit 119. With 2 consecutive short cycles, however, the second edge still shifts to bit 59, but the third edge shifts to bit 118. For multi-cycle paths such as in a microprocessor, this underscores the advantage of capturing several cycles in the latched-tapped delay chain—so that relationships between consecutive cycles can be identified and monitored.

Figure 2A:
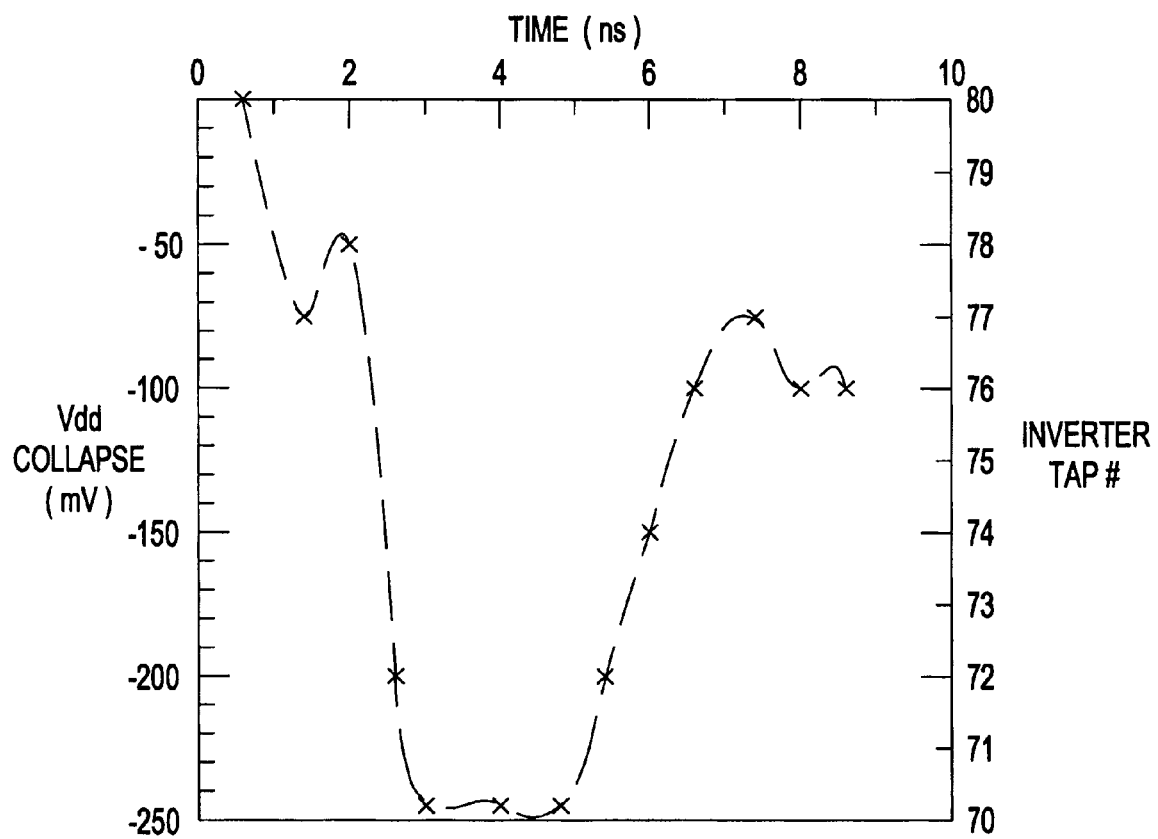
FIG. 2A shows a supply noise characterization plot relating supply line ($V_{dd}$ switching current) noise to performance degradation and, in particular, to the FO4 number reduction.
Figure 2B:
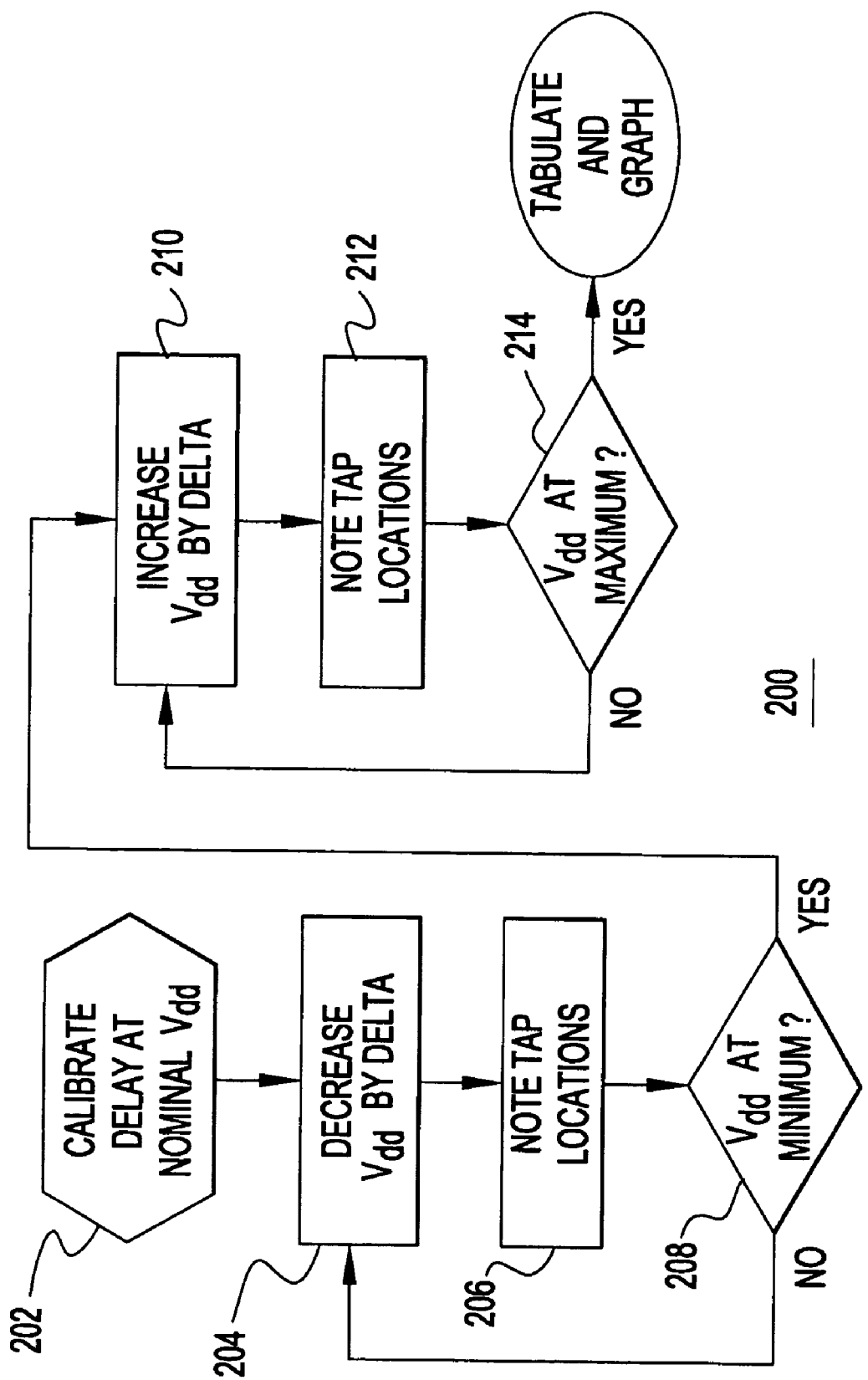
FIG. 2B shows an example of a flow diagram of steps in determining for a particular technology the relationship between switching current noise and FO4 number.

Additionally, as can be seen from the supply noise characterization plot of FIG. 2A, the present invention facilitates determining and relating supply line ($V_{dd}$ switching current) noise to performance degradation and, in particular, to the FO4 number reduction. FIG. 2B shows an example of a flow diagram 200 of steps in determining for a particular technology the relationship between switching current noise and FO4 number according to a preferred embodiment of the present invention, with reference to the circuit example 100 of FIG. 1. Alternately, other preferred embodiments such as FIG. 3A can also be used for Vdd waveform recovery. All of the steps in FIG. 2B are done under quiet chip conditions, i.e., where chip switching activity is kept to a minimum. First, in step 202 a run is done at nominal Vdd, and the tap positions are noted. Then, in step 204, the supply voltage is lowered by some delta, e.g., 25 millivolts (25 mV). In step 206, edge capture tap positions are noted. In step 208, a check is made to determine if a lower accepted supply voltage limit, e.g., 250 mV below specified nominal and, if not, returning to step 204 the supply is dropped and tap positions are noted in step 206. Once the lower limit is reached in step 208, in step 210 the supply voltage is raised by some delta, which may be the same as that used in ramping the supply voltage down, i.e., 25 mV. Then, in step 212 the captured edge tap positions are noted. In step 214, the supply voltage is checked to determine if an upper limit (nominal in this example) is reached and, if not, returning to step 210, the supply voltage is raised another delta and tap positions are noted in step 212. The calibration runs are completed in step 214 when the upper limit is reached and, the results may be tabulated with the resulting table indicating the on-chip FO4 number relationship to supply switching noise. Thus, for the particular technology of the example of FIG. 2A, each 25 mV drop in $V_{dd}$, whether from switching noise or arising from other sources, reduces the FO4 number by 1.

Figure 2C:
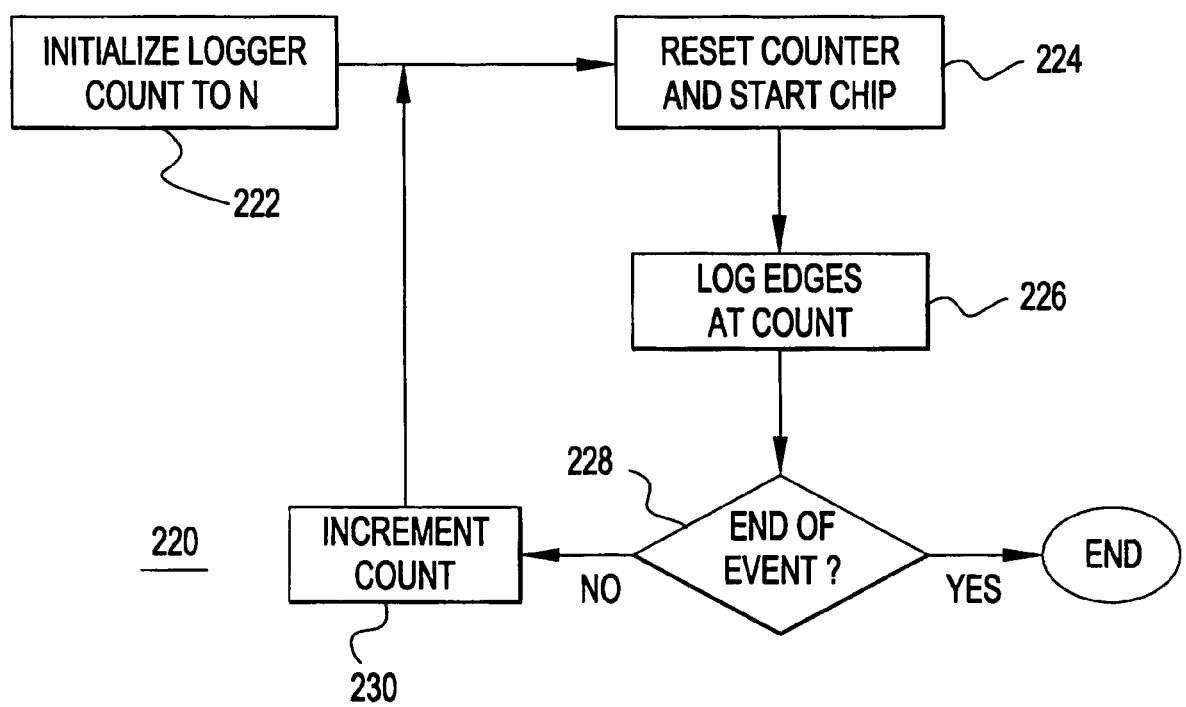
FIG. 2C shows an example of a flow chart for recovering a supply noise wave form.

As is also apparent from the supply noise characterization plot example of FIG. 2A, typical noise events are relatively long, lasting several cycles and even many cycles. Once the relationship between the FO4 number reduction and supply line drop is determined, e.g., as described for the flow chart of FIG. 2B, the present invention (e.g.,) can be used to accurately characterize supply noise, generating a plot similar to that of FIG. 2A, e.g., using the logic stage counter 100 of FIG. 1. FIG. 2C shows an example of a flow chart 220 for generating a characterization plot by iteratively logging edges during such an event. In step 222 a logger count is initialized to point to the beginning or just before the beginning of the particular event. Then, in step 224 both the cycle counter and the chip are initialized to an initial state and started. Essentially, supply noise is characterized by repeatedly scanning through the particular event and logging tap contents at successive cycles during the scan. So in step 226 in the first pass, the contents of the capture register are collected after N cycles, near in time to the beginning of the particular on-chip switching noise event and, in step 226 the tap locations are logged. In step 228 the current logger count is checked to determine if the count is at or after the end of the event. Next, since the count is not at the end of the event, in step 130, the logger count is incremented and, returning to step 224, the chip is restarted from the same initial state and run for N+1 cycles, and in step 226 the tap locations of the captured edges are logged. This is repeated for N+2 cycles, N+3 cycles, and etc., until in step 228, it is determined that the event has passed. The collected tap locations are converted to mV and the on-chip VDD level may be plotted against time (cycle number) to recover the waveform as in the example of FIG. 2A. Further, once the relationship between supply noise and FO4 number reduction is ascertained, such noise can be mitigated as described in issued U.S. Pat. No. 7,289,369, entitled "CLOCK GATED POWER SUPPLY NOISE COMPENSATION" to Phillip J. Restle, filed coincident herewith, assigned to the assignee of the present invention and incorporated herein by reference.

Figure 3A:
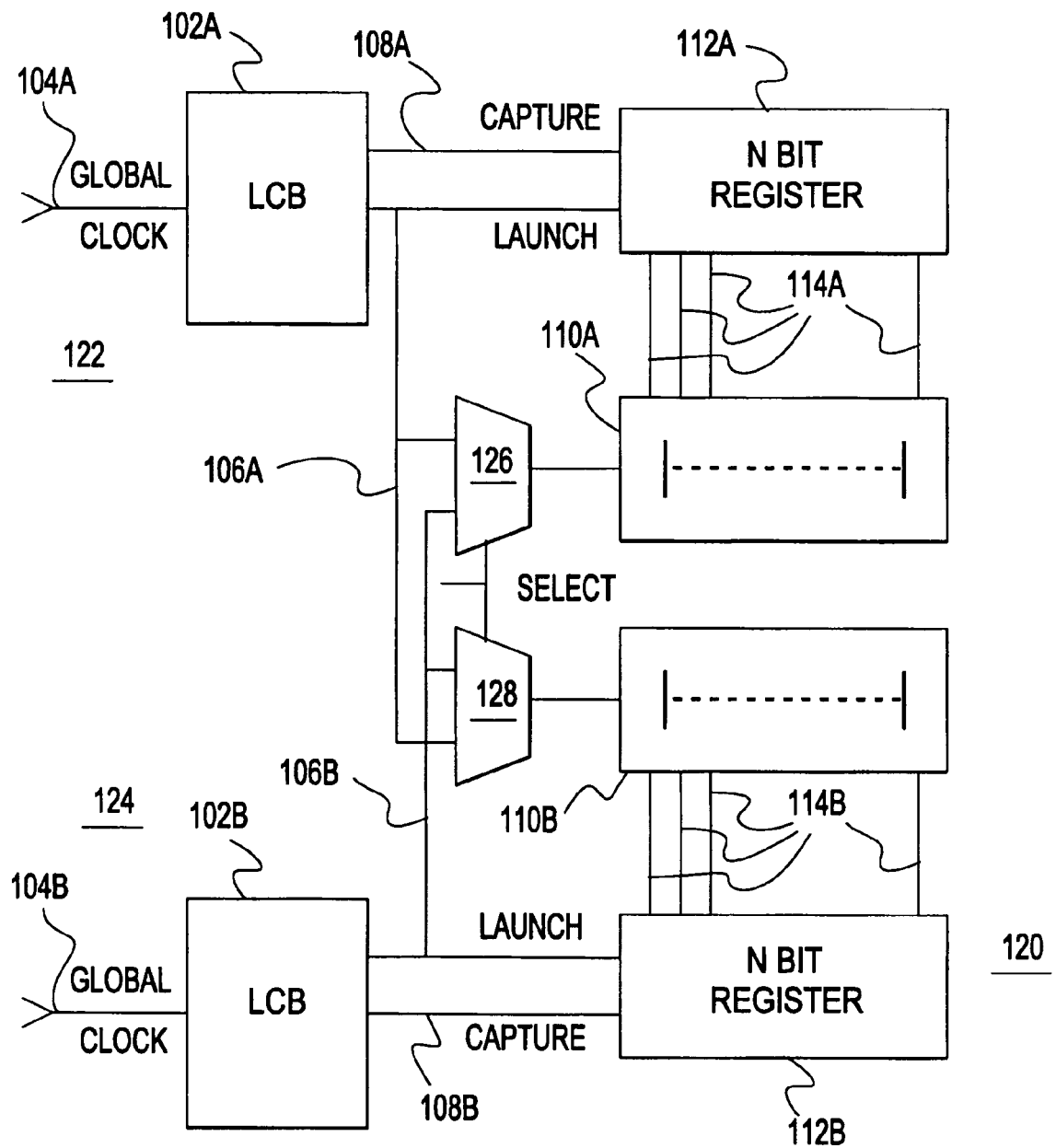
FIG. 3A shows a block diagram of another example of a logic stage counter with cross coupled clocks to account for clock skew.

FIG. 3A shows a block diagram of another example of a logic timing uncertainty quantifier 120 with cross coupled clocks to measure clock skew according to a preferred embodiment of the present invention. This example includes 2 paths 122, 124, similar to the single path 100 of FIG. 1 and, as in normal logic (e.g., microprocessor) paths, different local clock blocks can drive the launching and receiving registers. In this example, however, both launch clocks 106A, 106B are passed to select logic, e.g., a mutiplexor (mux) 126, 128 in each path 122, 124. Each mux 126, 128 selectively passes either its own local launch clock 106A, 106B, respectively, or the remote launch clock 106B, 106A to the local delay line 110A, 110B. For example, each path, e.g., 122, can select providing its own launch clock 106A to its delay 110A or, select the launch clock 106B from remote path 124.

In addition to locating jitter as described for the example of FIG. 1, this cross coupled embodiment better separates and quantizes chip wide timing uncertainty, accounting for global clock skew, as well as path delay variations. With a cross-coupled embodiment, in the absence of skew (or at least less than the granularity of one inverter stage delay) between the two global clock connections, clock edges launched from either clock 106A, 106B travel the same tap number in each of the two receiving delay lines 110B, 110A and, the clock edges are captured by the local capture clocks 108B, 108A at the same point in the registers 112B, 112A. Propagation is asymmetric when global clock skew exists between the two global clock inputs 104A, 104B. The asymmetry occurs because one of the global clocks 104A, 104B arrives at the particular LCB 102A, 102B before the other and so one of the launch clocks, has a head start over the other. So, because of that head start, one edge propagates farther along its respective delay line compared to the other, before being captured. Also, the capture clock of the "late" LCB will occur later compared to the "early" LCB, which gives the launch edge with the head start even more time to travel through inverters before it is captured, compared to the other.

Thus, by locating the edges in the delay lines 110A, 110B, first with passing the local launch clock 106A, 106B through the respective mux 126, 128, and then, switching the muxes 126, 128 to pass the remote launch clocks, e.g., 106B, 106A, respectively, global clock skew can also be quantified. By utilizing the muxes 126, 128 to select the remote launch clock, total timing uncertainty can be measured more completely.

Figure 3B:
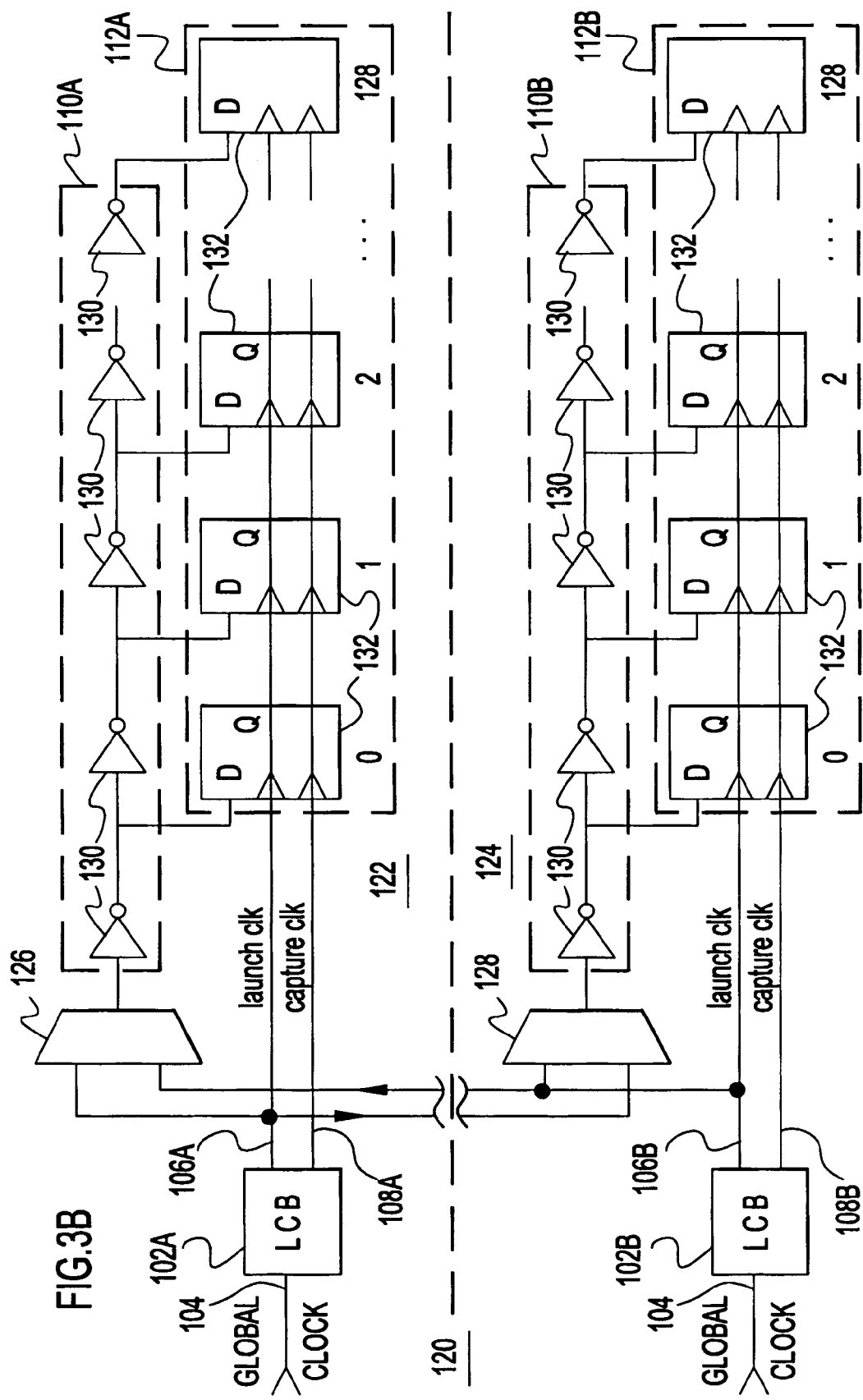
FIG. 3B shows a gate level diagram of the example of FIG. 3A.

FIG. 3B shows a gate level diagram of the example of FIG. 3B, with like features labeled identically. In this example, each delay line 110A, 110B is N series connected inverters 130 which drive the delay tap outputs 114. Each N bit register 112A, 112B includes N master-slave type flip flops or latches 132. After setting each of muxes 126, 128 to select an input, the measurement begins when the local LCB 102A, 102B drives the corresponding selected launch clock 106A, 106B to enable the latches 132 in the corresponding registers 112A, 112B. Coincidentally, the selected clock passes through the muxes 126, 128 and begins propagating through the selected delay path 122, 124, i.e., the respective series connected inverters 130. When the local capture clock 108A, 108B arrives, the state of the inverters 130 is captured in the respective registers 110A, 110B.

Thus, in the above examples, the raw data that is captured in the capture latches (e.g., 132 of registers 112A, 112B) as a pattern of alternating 0's and 1's from the inverters 130 in the corresponding delay chains 110A, 110B. As noted above, edges may be identified by a switch in the pattern, e.g., from 1's and 0's to 0's and 1's and back. So, the exception in the alternating pattern locates where an edge has been captured and is an identical pair of consecutive 0's or consecutive 1's. These locations can be identified by exclusive ORing (XOR) or NORing (XNOR) the contents of adjacent latches 132, which results in a 0 (or 1) in the clock edge locations and 0s (or 1s) in all remaining locations. Further, the clock edge locations can be more precisely located by including one or more variable delay stages in delay lines 110A, 110B or for LCBs 102A, 104A to slew the clock edges within a delay stage, such that the edges move to the next or the previous stage.

Figure 4:
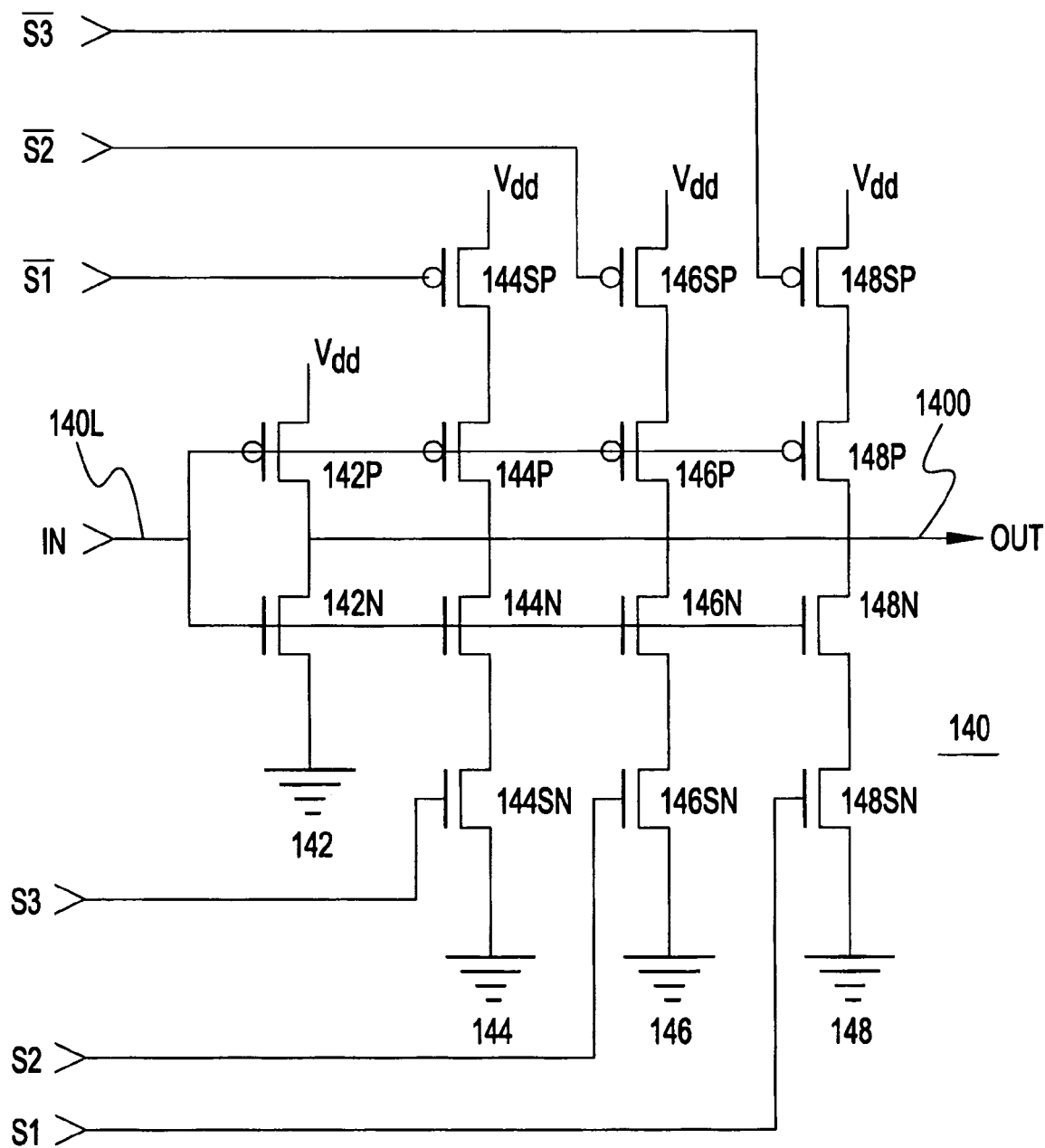
FIG. 4 shows an example of a selectable delay inverter for sliding the timing edge to more precisely locate the timing edge within the delay.

FIG. 4 shows an example of a selectable delay inverter 140 for sliding the timing edges to more precisely locate the timing edges within the delay 110. Essentially, in this example, selectable delay inverter 140 includes a single inverter 142 with three parallel selectable inverters 144, 146, 148. Inverter 142 includes a single p-type field effect transistor (PFET) 142P and a single n-type field effect transistor (NFET) 142N connected at the drains at output 140O and in series between a supply ($V_{dd}$) and ground. Each selectable inverter 144, 146, 148 includes a select PFET 144SP, 146SP, 148SP between the supply and an inverter PFET 144P, 146P, 148P and a select NFET 144SN, 146SN, 148SN connected between a inverter NFET 144N, 146N, 148N and ground. The drain of each inverter PFET 144P, 146P, 148P is connected to a corresponding inverter NFET 144N, 146N, 148N at output 140O, which is the common connection to the drains of all inverter PFETs 142P, 144P, 146P, 148P and NFETs 142N, 144N, 146N, 148N. The input 140I of selectable delay inverter 140 is the common gate connection to the gates of all inverter PFETs 142P, 144P, 146P, 148P and NFETs 142N, 144N, 146N, 148N. Each of the parallel selectable inverters 144, 146, 148 are selected/deselected by a corresponding pair of complementary select signals, collectively, S1, S2, S3.

Maximum selectable delay inverter 140 delay is realized with all of the parallel selectable inverters 144, 146, 148 deselected and only inverter 142 driving output 140O. Selectable delay inverter 140 delay is reduced by selecting one or more of parallel selectable inverters 144, 146, 148, effectively increasing the output 140O drive. Correspondingly, selectable delay inverter 140 delay is increased from minimum (with all three selectable inverters 144, 146, 148 enabled) by deselecting one or more of parallel selectable inverters 144, 146, 148, effectively decreasing the output 140O drive. Although each of the parallel selectable inverters 144, 146, 148 may be tailored to provide different delay reductions, preferably, each provides an identical delay difference, e.g., 3 picosecond (3 ps) delay increase/reduction for a normal delay line inverter delay of 20 ps. Thus, for example, the selectable delay inverter 140 may be set for minimum delay with all of the parallel selectable inverters 144, 146, 148 selected. Once the edges are located, e.g., deselecting all 3 parallel selectable inverters 144, 146, 148, in subsequent passes to scan the edges past the delay path inverter/capture latch boundaries by sequentially selecting additional parallel selectable inverters 144, 146, 148.

Figure 5:
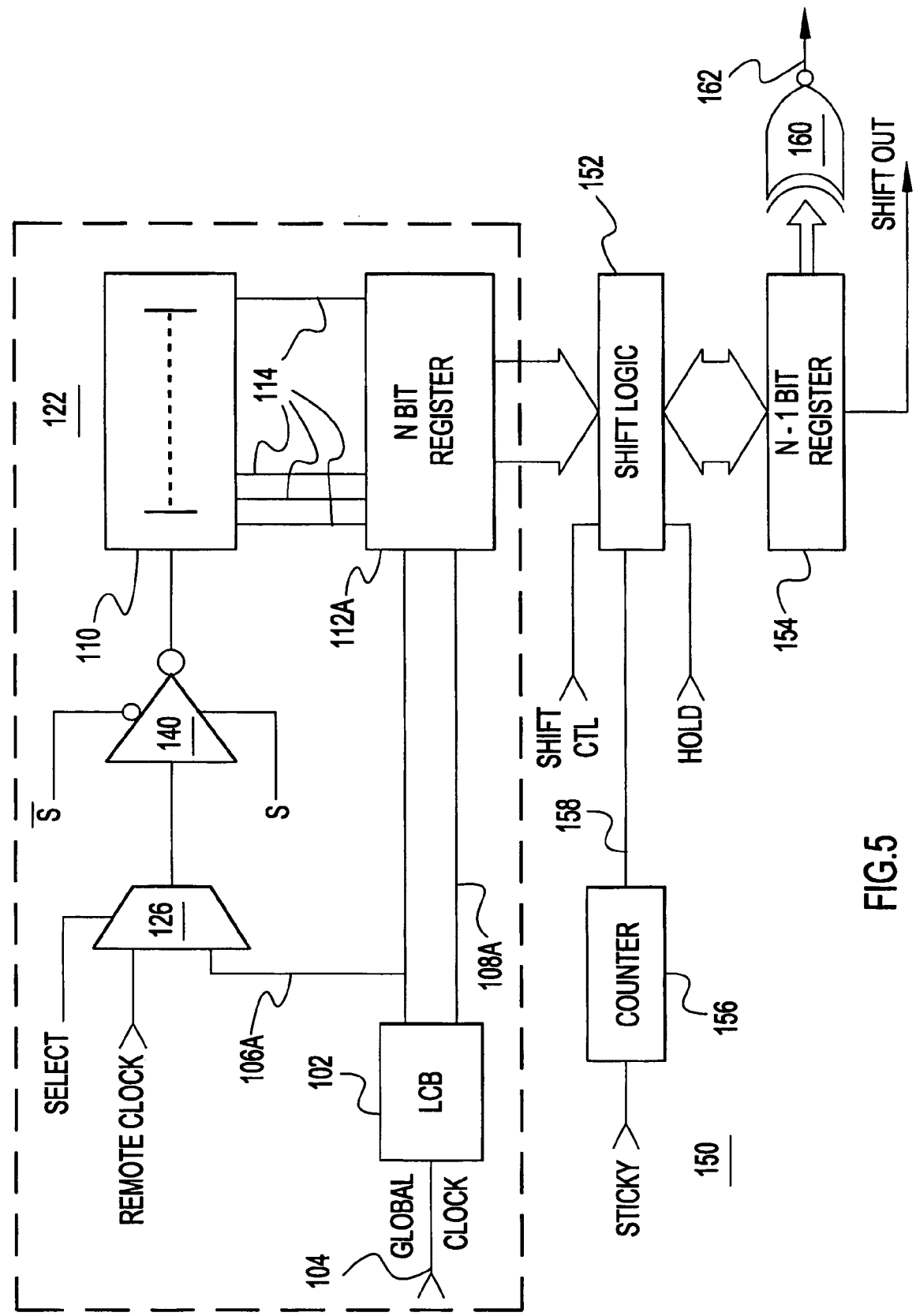
FIG. 5 shows an example of an application of the preferred embodiment logic stage counter selectively timed with a selectable delay inverter that is capable of holding and passing captured edges on for subsequent analysis.

FIG. 5 shows a cross sectional example of an application of preferred embodiment logic timing uncertainty quantifier 150, e.g., 122 of FIG. 3A, selectively timed with a selectable delay inverter, e.g., 140 of FIG. 4, that is capable of holding and passing captured edges on for subsequent analysis. Shift logic 152 selectively passes the contents of capture register 112A to a sticky register 154, e.g., an N−1 bit register. A counter 156 counts for a selected period and at the end of the period the output (a sticky_mode line) 158 of the counter 156 initiates sticky mode in shift logic 152, accumulating capture edge locations. The sticky register 154 contents are provided to error-detect logic 160, which identifies shifting timing edges for example, and provides an error indication 162 upon detection of an error.

So, when the counter 156 receives a request for sticky mode, the counter 156 delays until a selected count completes, e.g., counting down to delay data logging until after certain start-up transients have subsided. Optionally, a binary delay cycle number may be scanned into the counter 156 with the counter 156 counting down to zero from that number. Once the count down is complete, the counter output 158 is asserted to initiate sticky mode and data logging begins. Additionally in this example, selectable delay inverter 140 provides a fine delay adjust in the delay line path for better than single inverter time resolution, e.g., 3 ps increments, to more precisely locate where in the captured bucket (register latch location) the captured edges fall. For example, if the inverter delay is 20 ps, captured edges may be located anywhere within that 20 ps interval. Adding fine delay in 3 ps increments, e.g., by deselecting parallel inverters (144, 146, 148 in FIG. 4) until an edge moves to the next bucket (i.e., is captured in the next capture latch), accurately locates the edge within the 20 ps window. With each measurement, error detect logic 160 compares the edge bit locations in the sticky-register with a programmable (trigger_mask) mask, i.e., a bit set that pre-defines valid edge locations or valid edge ranges. An edge falling outside of this valid bit range or zone is an error. Upon occurrence of an error, the error output signal 162 is initiated and provided, for example, to a service processor to log the event and other selected system state information.

Figure 6:
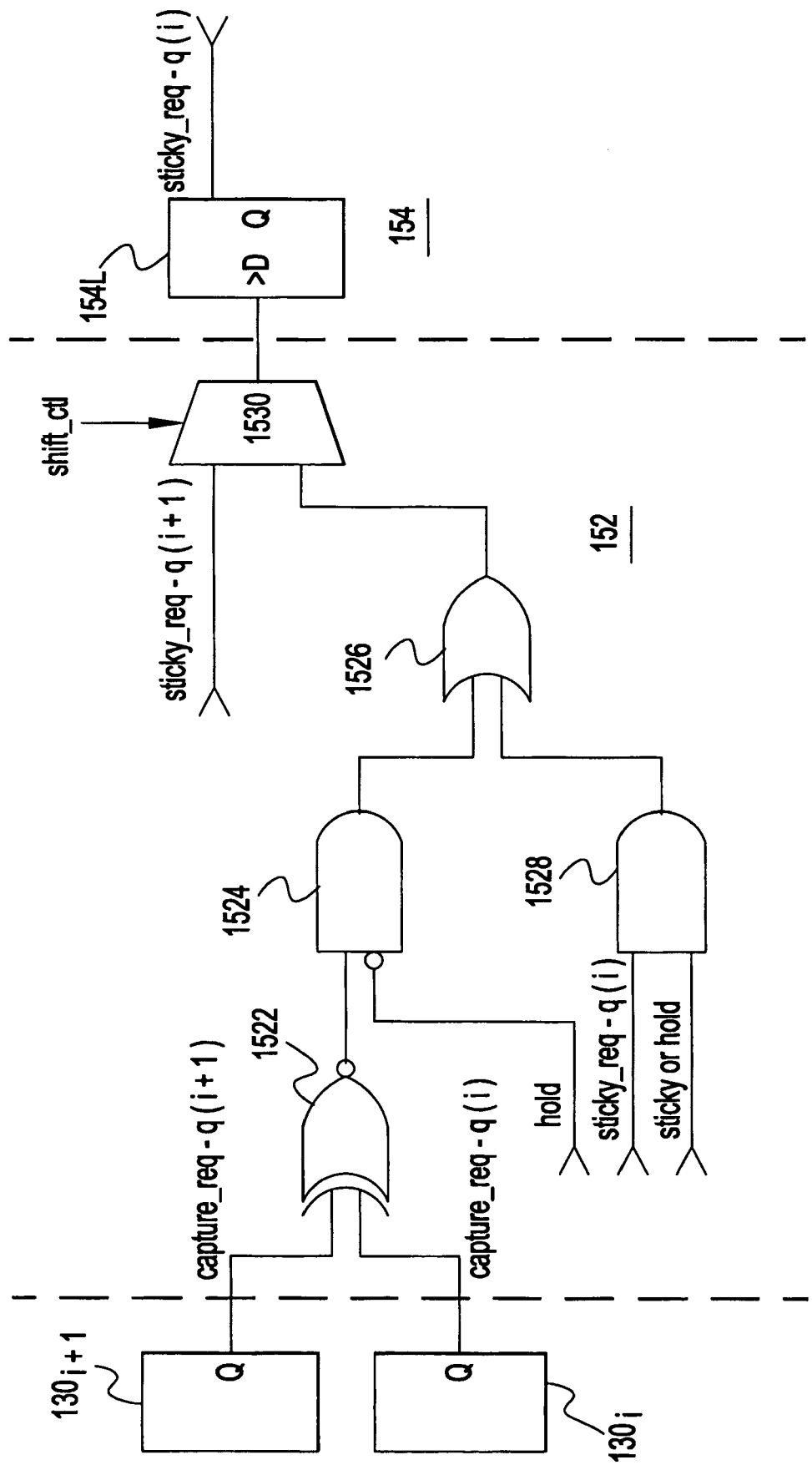
FIG. 6 shows a cross sectional example of sticky, hold and shift logic.

FIG. 6 shows a cross sectional example of data logging logic 152 with reference to the example of FIG. 5. In this example, one or more of the capture registers (e.g., 112A with representative latches $130_i$, $130_{i+1}$) selectively provide data to the sticky register 154, which preferably is a parallel in/serial out shift register. A single sticky register latch 154L is shown in this cross section. The data logging logic 152 includes an XNOR 1522 performing a bitwise compare at each neighboring pair of capture latches $130_i$, $130_{i+1}$ with a match indicating the forward edge of the clock. When an edge is captured, the compare results in a single 1 at an XNOR 1522 at the captured edge from the 2 consecutive 1's or 0's and zeros elsewhere. The XNOR 1522 output is an input to an AND gate 1524 and hold select not (hold_mode_n) is a second input. The output of AND gate 1524 is an input to OR gate 1526. A second AND gate 1528 combines the hold/sticky select signal (hold_mode or sticky_mode) with a corresponding sticky register bit (sticky_reg_q(i)) and its output is a second input to OR gate 1526. Optionally, each of 1524, 1526 and 1528 may be a NAND gate, which is logically equivalent to the illustrative AND-OR combination. The output of OR gate 1526 is an input to sticky shift MUX 1530 and an adjacent sticky register bit (sticky_reg_q(i+1)) is a second input. The output of sticky shift MUX 1530 is an input to the sticky register 154.

In hold mode, the capture latch data, i.e., from one capture register 112N, is written into and frozen in a separate register, i.e., the sticky register 154. Similarly, in sticky mode the capture latch edges can accumulate over a number of cycles in the sticky register 154. So, if timing uncertainty causes a previously captured edge to move to another capture latch, then the sticky register 154 location of the originally captured edge keeps the 1 state. However, the capture latch also captures the bit location corresponding to the new position. In this way, the extremes of the movement (total timing uncertainty) of the captured edges are detected and stored in the sticky register 154. Also, the sticky register contents can be read out on the fly using a functional shift, i.e., without using scan-path latches and without stopping the clocks. Then, a service processor (not shown) can perform data logging on the output and analyze the edge detection events stored in the sticky register.

Advantageously, the present invention facilitates the determination of timing uncertainty in synchronous very large scale integration (VLSI) chips such as microprocessors and the like. Further, the present invention facilitates directly measuring and monitoring the total synchronous data path timing uncertainty, previously unquantifiable with any accuracy. So, designers can compensate more accurately for clock skew, clock jitter, power supply noise, and across-chip gate variation rather than budgeting a portion of the useful cycle as dead time to compensate for estimated such variations. By contrast, the present invention facilitates measuring this total timing uncertainty and, further, precisely locating upper and lower bounds under real chip workloads. From this, rather than using budgeted based estimates, designer can ascertain how many logic stages can be completed in one cycle and how that number changes from cycle to cycle with all sources of timing uncertainty. Total timing uncertainty with technology scaling can now also be understood. Thus, the present invention allows designers to determine the number of combinational logic stages that can be completed in a cycle, factoring in all sources of timing uncertainty on a cycle by cycle basis and, further, to monitor and log worst-case timing excursions.

While the invention has been described in terms of preferred embodiments, those skilled in the art will recognize that the invention can be practiced with modification within the spirit and scope of the appended claims.

What is claimed is:

1. A circuit for measuring timing uncertainties in a clock signal, said circuit comprising:
    a local clock buffer receiving a global clock and providing a local clock;
    a multiplexor receiving said local clock and a remote clock, said multiplexor selectively providing said local clock and said remote clock;
    a delay line receiving one of said local clock and said remote clock from said multiplexor, said selected one traversing said delay line and being provided as an output at output taps along said traversed delay line; and
    a register clocked by said local clock and capturing the state of said output taps, progression of said selected clock through said delay line being captured in said register.

2. A circuit as in claim 1 wherein said delay line is at least 3 global clock cycles long.

3. A circuit as in claim 2 wherein said delay line taps are evenly spaced along said delay line and a clock edge in said delay line is identified by a matched state at a pair of adjacent said delay line taps.

4. A circuit as in claim 1 wherein said local clock is a complementary pair of local clocks, said delay line receiving a first local clock of said complementary pair of local clocks, and said remote clock is said first local clock from a second said circuit.

5. A circuit as in claim 1 wherein said delay line is a number (N) of series connected inverters, an output of said multiplexor being an input to said series connected inverters.

6. A circuit as in claim 5 wherein said register is an N bit register, each bit receiving an output of one of said series connected inverters.

7. A circuit as in claim 5 wherein one of said series connected inverters is an adjustable delay inverter selectably varying delay in said delay line.

8. A circuit as in claim 1 wherein said register is an N bit register, said circuit further comprising:
    a second register, said second register being an N−1 bit register selectively receiving the contents of said N bit register.

9. A circuit as in claim 8, said circuit further comprising:
    a compare receiving the contents of said second register and detecting clock edges falling outside of an acceptable range.

10. A circuit as in claim 9 wherein said compare
    compares second register bit patterns against a selectable signature bit pattern indicating expected edge locations, and
    generates an interrupt signal for a service processor if a clock edge is determined to occur other than in an expected edge location.

11. A circuit as in claim 8 further comprising:
    an adjustable delay receiving an output from said multiplexor and selectably delaying said output, said selectably delayed output being a time shifted one of said local clock and said remote clock.

12. A circuit as in claim 8 wherein contents of said second register may be held over a selected number of clock cycles.

13. A circuit as in claim 8 wherein contents of said second register may be shifted out in a functional shift without stopping the clocks or using a scan path.

14. A circuit as in claim 8 wherein clock edges may be accumulated over a selected number of clock cycles.

15. A circuit as in claim 14 wherein accumulated said clock edges indicate a clock jitter range.

16. A circuit as in claim 15 wherein accumulated said clock edges indicate clock skew and power supply noise related timing uncertainty in each cycle.

17. A circuit as in claim 1 measuring jitter, skew and power supply noise related timing uncertainty in each cycle.

18. A circuit as in claim 1 further comprising a start counter delaying data logging until after a selected number of clock cycles.

19. A circuit for measuring timing uncertainties in a clocked data path, said circuit comprising a cross coupled pair of timing variation measurement circuits, each of said cross coupled pair comprising:
    a local clock buffer receiving a global clock and providing a complementary pair of local clocks;
    a multiplexor receiving a first local clock of said complementary pair of local clocks and a remote clock, said remote clock being said first local clock from another of said cross coupled pair, said multiplexor selectively providing said first local clock and said remote clock as a multiplexor output;
    a delay line receiving a timing signal from said multiplexor output, said timing signal traversing said delay line and being provided as an output at output taps along said traversed delay line; and
    a capture register clocked by said complementary pair, connected to said output taps and receiving said output from said output taps, progression of said timing being captured in said capture register.

20. A circuit as in claim 19 wherein each said delay line is at least 3 clock cycles long.

21. A circuit as in claim 20 wherein said delay line taps are evenly spaced along said each delay line and a timing signal edge in said delay line is identified by a matched pair of adjacent said delay line taps.

22. A circuit as in claim 20 wherein each said delay line is a number (N) of series connected inverters, an output of said multiplexor being provided to said series connected inverters.

23. A circuit as in claim 22 wherein each said capture register is an N bit register, an input to each bit of said each capture register is connected to an output of one of said series connected inverters.

24. A circuit as in claim 23 wherein one of said series connected inverters is an adjustable delay inverter selectably varying delay in said delay line.

25. A circuit as in claim 23, each of said cross coupled pair further comprising:
   a second register, said second register being an N−1 bit register selectively receiving the contents of said N bit register; and
   a compare receiving the contents of said second register and detecting clock edges falling outside of an acceptable range.

26. A circuit as in claim 25 wherein said compare
compares capture register bit patterns against a selectable signature bit pattern indicating expected edge locations, and generates an interrupt signal to a service processor if a clock edge is determined to occur other than in an expected edge location.

27. A circuit as in claim 25, each of said cross coupled pair further comprising:
   data logging control logic receiving a hold control signal selectively holding contents of said second register over a selected number of clock cycles and a sticky input accumulating clock edges in said second register over a selected number of clock cycles.

28. A circuit as in claim 27 measuring jitter, skew and power supply noise related timing uncertainty in each cycle.

29. A circuit as in claim 24 further comprising a start counter delaying data logging until after a selected number of clock cycles.

* * * * *